(12) United States Patent
Huang

(10) Patent No.: US 9,818,671 B2
(45) Date of Patent: Nov. 14, 2017

(54) LIQUID-COOLED HEAT SINK FOR ELECTRONIC DEVICES

(71) Applicant: Dynatron Corporation, Union City, CA (US)

(72) Inventor: Tai-Chi Huang, Union City, CA (US)

(73) Assignee: Dynatron Corporation, Union City, CA (US)

(*) Notice: Subject to any disclaimer, the term of this patent is extended or adjusted under 35 U.S.C. 154(b) by 235 days.

(21) Appl. No.: 14/618,753

(22) Filed: Feb. 10, 2015

(65) Prior Publication Data
US 2016/0234968 A1 Aug. 11, 2016

(51) Int. Cl.
*F28F 7/00* (2006.01)
*H01L 23/427* (2006.01)
*G06F 1/20* (2006.01)
*H01L 23/467* (2006.01)
*H01L 23/367* (2006.01)
*H01L 21/48* (2006.01)

(52) U.S. Cl.
CPC .............. *H01L 23/427* (2013.01); *G06F 1/20* (2013.01); *H01L 23/467* (2013.01); *H01L 21/4882* (2013.01); *H01L 23/367* (2013.01)

(58) Field of Classification Search
CPC .. H05K 7/20; H05K 7/20263; H05K 7/20272; F28F 7/00; F28F 7/02; H01L 23/367; H01L 23/467; H01L 21/4882; H01L 23/427; G06F 1/20
USPC ........... 165/80.2, 80.4, 104.33; 361/699, 700
See application file for complete search history.

(56) References Cited

U.S. PATENT DOCUMENTS

| | | | |
|---|---|---|---|
| 6,749,012 B2* | 6/2004 | Gwin | F28F 9/002 165/104.33 |
| 6,809,928 B2* | 10/2004 | Gwin | G06F 1/20 165/80.4 |
| 7,021,367 B2* | 4/2006 | Oikawa | F28D 15/02 165/185 |
| 7,249,625 B2* | 7/2007 | Duan | G06F 1/20 165/104.28 |
| 7,312,995 B2* | 12/2007 | Wilson | G06F 1/20 165/121 |
| 7,467,657 B2* | 12/2008 | Pawlak, III | G06F 1/20 165/104.33 |
| 7,971,632 B2 | 7/2011 | Eriksen | |
| 8,245,764 B2 | 8/2012 | Eriksen | |

(Continued)

*Primary Examiner* — Justin Jonaitis
*Assistant Examiner* — Gustavo Hincapie Serna
(74) *Attorney, Agent, or Firm* — Wang Law Firm, Inc.

(57) ABSTRACT

A heat sink includes a heat absorption module, a liquid transport module and a heat exchange module. The transport module includes one inlet and outlet tubes, each having a first end connected spatially with the heat absorption module. The heat exchange module includes a fin assembly, one fan unit and several connection passages extending through the fin assembly. One end portion of the fin assembly defines a liquid storage chamber, which is divided into several first chambers therein such that first ends of the connection passages extend respectively into the first chambers. The other end portion of the fin assembly defines two second chambers such that second ends of the connection passages extend respectively into the second chambers while a second end of each inlet and outlet tubes is connected spatially with a first and second pump units, which are in spatially communicated with the first chambers.

2 Claims, 5 Drawing Sheets

(56) References Cited

U.S. PATENT DOCUMENTS

| | | | |
|---|---|---|---|
| 8,274,787 B2 | 9/2012 | Alyaser et al. | |
| 8,356,505 B2 | 1/2013 | Carper et al. | |
| 2002/0117291 A1* | 8/2002 | Cheon | G06F 1/20 165/80.4 |
| 2005/0083656 A1* | 4/2005 | Hamman | F28D 15/00 361/699 |
| 2005/0168939 A1* | 8/2005 | Iijima | F28D 1/05375 361/679.47 |
| 2006/0021737 A1* | 2/2006 | Lee | F28D 15/00 165/80.4 |
| 2006/0067052 A1* | 3/2006 | Llapitan | F28D 1/05375 361/700 |
| 2006/0137863 A1* | 6/2006 | Lee | G06F 1/20 165/104.33 |
| 2007/0068653 A1* | 3/2007 | Kondou | F28D 1/0477 165/80.4 |
| 2007/0089859 A1* | 4/2007 | Wei | G06F 1/20 165/80.4 |
| 2007/0175610 A1* | 8/2007 | Yeh | H01L 23/473 165/80.4 |
| 2008/0164011 A1* | 7/2008 | Chen | F04D 13/12 165/104.33 |
| 2008/0179041 A1* | 7/2008 | Hu | F28D 1/05375 165/71 |
| 2008/0179044 A1* | 7/2008 | Hu | H01L 23/473 165/80.4 |
| 2008/0179045 A1* | 7/2008 | Hu | H01L 23/473 165/80.4 |
| 2008/0223552 A1* | 9/2008 | Onishi | F28D 1/0341 165/80.4 |
| 2009/0205809 A1* | 8/2009 | Wan | F28D 1/05366 165/80.4 |
| 2009/0205810 A1* | 8/2009 | Wan | G06F 1/20 165/80.4 |
| 2009/0272512 A1* | 11/2009 | Huang | F28D 15/00 165/80.4 |
| 2013/0146253 A1* | 6/2013 | Daly | H05K 7/20281 165/80.4 |
| 2015/0131229 A1* | 5/2015 | Matsunaga | H01L 23/427 361/700 |
| 2016/0021784 A1* | 1/2016 | Choi | H05K 7/20927 165/80.4 |
| 2016/0120063 A1* | 4/2016 | Cheng | H05K 7/20927 165/80.4 |

* cited by examiner

LIQUID-COOLED HEAT SINK FOR ELECTRONIC DEVICES

BACKGROUND OF THE INVENTION

1. Field of the Invention

The present invention relates to a liquid-cooled heat sink for an electronic device, more particularly to a liquid-cooled heat sink, in which the installation position of a pump unit and the flow path of cooling liquid in the heat exchange module are altered, thereby minimizing the size, simplifying the structure and enhancing heat dissipating effects of the liquid-cooled heat sink.

2. The Prior Techniques

When computer or any other electronic devices operate, the heat produced by the central processor unit (CPU), chips and other processing units in the chassis has to be expelled fast and effectively to exterior to keep the temperature in chassis within the manufactory suggested range, and therefore to protect the electronic units from being damaged or destroyed.

Air-cooled heat sinks are generally and traditionally used to cool down the CPU, the chips or other processing unit. In most cases, heat sinks are in contact with an outer surface of the CPU, the chip or the other processing unit in order to absorb heat while a fan unit is placed on or nearby the heat sink assembly to expel the generated heat on the fins by downstream air flow produced by the fan unit. Today, with frequent upgrades of the CPU and the chips, more calculations should take place in these units since more heat is created. Traditional air-cooled heat sinks can no longer meet the requirement of high-end computers or electronic devices.

Another cooling method is the liquid-cooled system. The liquid-cooled system utilizes a pump to circulate liquid within a looped system, while providing a heat exchanger to absorb the heat transferred by the liquid and to expel. Some liquid-cooled heat sinks are disclosed by US Patents, like U.S. Pat. Nos. 7,971,632, 8,245,764, 8,274,787 and 8,356,505.

In general, the liquid-cooled heat sink provides higher effective heat dissipation ability. However, the liquid-cooled heat system includes more components. This can potentially increase the assembly time and size of the cooling system, which can cause trouble on suit user's requirements. More components could also have increased leakage potential factor in the liquid-cooled heat sinks. Additionally, a large size of the system can affect the work effectiveness of the pump to be low, which causes the dissipating rate hard to improve.

FIG. 1 illustrates a heat exchange module H employed in a prior art heat sink. The heat exchange module H includes a fin assembly H1 constituted by a plurality of fins disposed in parallel manner, a plurality of connection passages H2 extending through two end portions of the fin assembly H1. The first end portion of the fin assembly H1 defines a first chamber H3 while the second end portion thereof defines two second chambers H41, H42. The second chamber H41 has a bottom surface formed with an inlet opening H5 for connection with a liquid inlet tube (not visible). The other second chamber H42 has a bottom surface formed with an outlet opening H6 for connection with a liquid outlet tube (not visible). Once the cool liquid, after absorbing the heat, enters into the second chamber H41 via the inlet opening H5, the cool liquid flows into the first chamber H3 via a portion of the connection passages H2 interconnecting the first chamber H3 and the second chamber H41. Afterward, the cool liquid flows from the first chamber H3 into the other second chamber H42 via the other portion of the connection passages H2 interconnecting the first chamber H3 and the second chamber H42, thereby establishing a generally U-shaped flow direction (shown in solid arrow in FIG. 1). Upon activation of a fan unit (not shown) the heat absorbed in the cool liquid is dissipated by the fin assembly H1 while the liquid flows through these chambers.

SUMMARY OF THE INVENTION

Therefore, the object of the present invention is to provide an improved liquid-cooled heat sink, thereby minimizing the size and simplifying the structure in which the liquid flowing path is extended to enhance heat dissipating effects.

Features of the present invention include a heat absorption module, a liquid transport module and a heat exchange module, wherein the liquid transport module includes at least one inlet tube and an outlet tube. Each of the inlet and outlet tubes has one end connected spatially with the heat absorption module while the other end connected spatially with first and second pump units, which in turn are connected spatially with a liquid storage chamber defined by the heat exchange module, thereby minimizing the size and simplifying the structure of the liquid-cooled heat sink of the present invention.

Another feature of the present invention is the improvement design of the heat exchange module, to be more specific, the heat exchange module includes a fin assembly that contains a relatively long liquid flow path such that heat absorbed by the fluid will transfer to fin assembly more efficiently and it further improves the heat dissipation efficiency.

A liquid-cooled heat sink of the present invention includes a heat absorption module, a liquid transport module and a heat exchange module, the liquid transport module including at least one inlet tube and an outlet tube. Each of the inlet and outlet tubes has one end connected spatially with the heat absorption module. The other end of outlet tube is spatially connected to a first pump unit while the other end of inlet tube is spatially connected to a second pump unit. The first and second pump units are installed within a liquid storage chamber defined by the heat exchange module. The heat exchange module includes a fin assembly, at least one fan unit and a plurality of connection passages extending through two opposite end portions of the fin assembly. The liquid-cooled heat sink is characterized in that the liquid storage chamber is further divided into a plurality of first chambers such that first ends of the connection passages extend respectively into the first chambers, while the other end portion of the fin assembly defining a plurality of second chambers such that second ends of the connection passages extend respectively into the second chambers.

In one embodiment, the liquid-cooled heat sink of the present invention further includes a pump seat which is fixed in the liquid storage chamber and upon which the first and second pump units are installed thereon so as to minimize the overall size of the liquid-cooled heat sink of the present invention.

BRIEF DESCRIPTION OF THE DRAWINGS

Other features and advantages of this invention will become more apparent in the following detailed description of the preferred embodiments of this invention, with reference to the accompanying drawings, in which.

DETAILED DESCRIPTION OF THE PREFERRED EMBODIMENT

Figure 1:
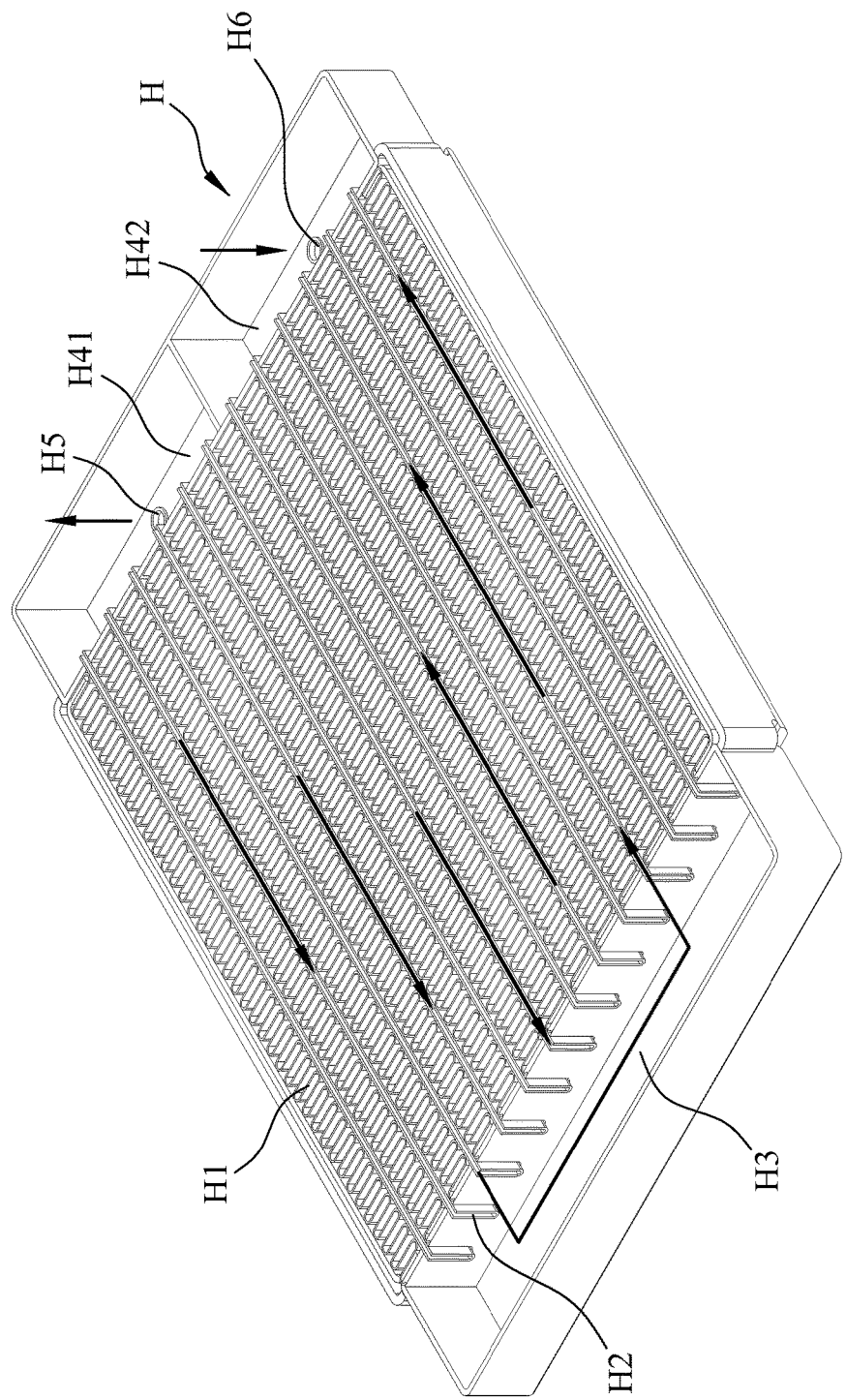
FIG. 1 shows a perspective view of a heat exchange module employed in a prior art liquid-cooled heat sink, wherein the solid arrows respectively indicate liquid flow directions therein.
Figure 2:
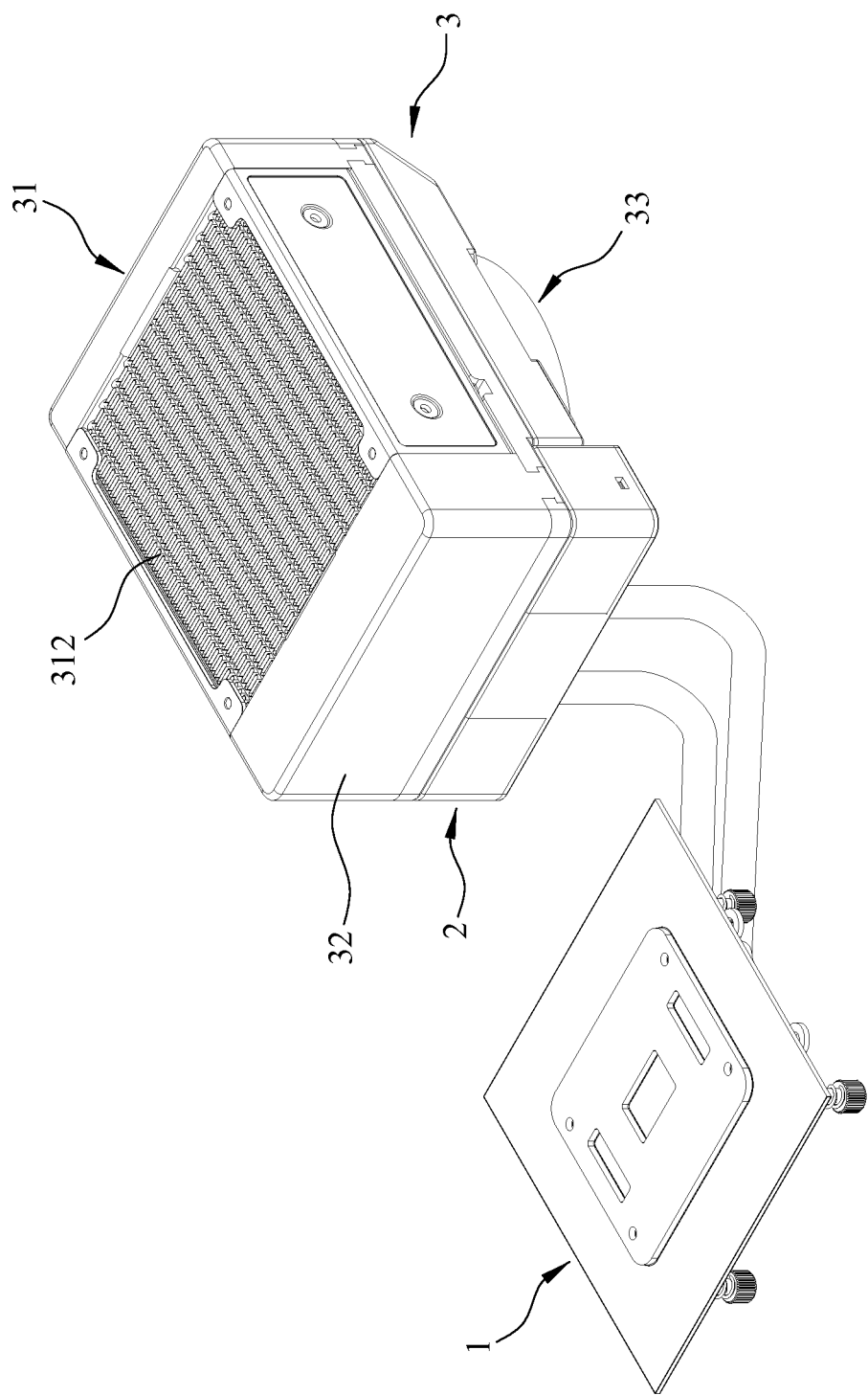
FIG. 2 is a 3D exterior view of a liquid-cooled heat sink of the present invention.
Figure 3:
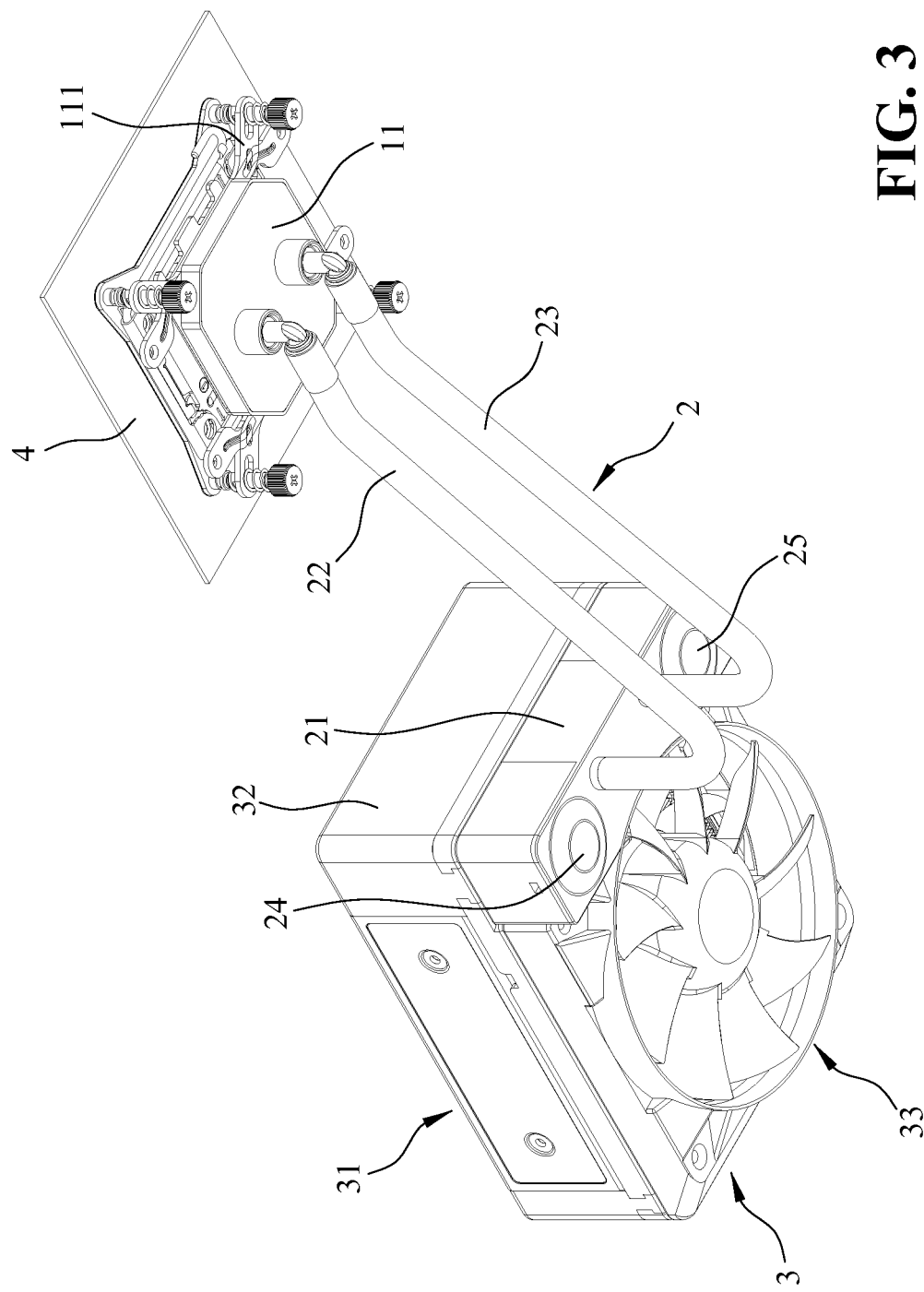
FIG. 3 shows a 3D view of the liquid-cooled heat sink of the present invention from another angle.
Figure 4:
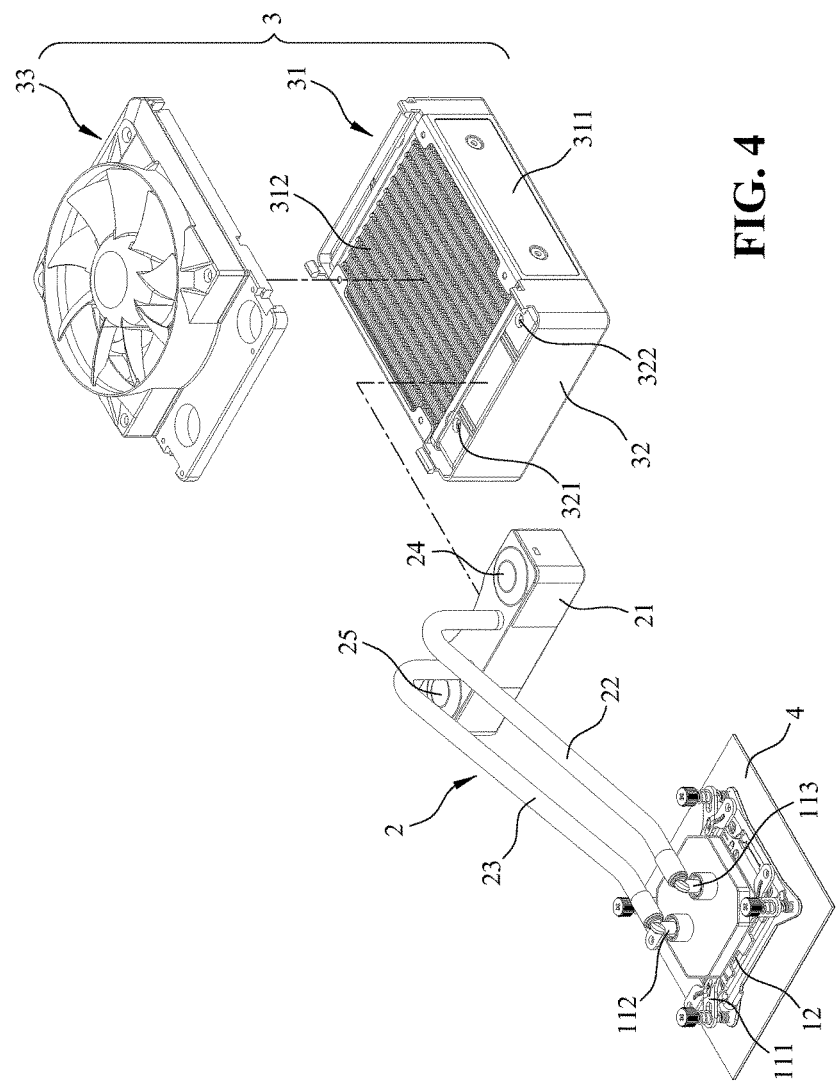
FIG. 4 shows a partially exploded view of the liquid-cooled heat sink of the present invention.

Referring to FIGS. 2 to 4, wherein FIG. 2 is a perspective view of a liquid-cooled heat sink of the present invention; FIG. 3 shows a perspective view of the liquid-cooled heat sink of the present invention from another angle; and FIG. 4 shows a partially exploded view of the liquid-cooled heat sink of the present invention. As shown, the liquid-cooled heat sink of the present invention accordingly includes a heat absorption module 1, a liquid transport module 2 and a heat exchange module 3, wherein, the heat absorption module 1 includes a liquid storage container 11 constituted by a plurality of sidewalls so as to contain cool liquid therein, has at least one heat conductive side 12 and on the other sides, where a liquid inlet 112 and a liquid outlet 113 are formed. Preferably the liquid inlet 112 and the liquid outlet 113 are symmetrically located relative to each other so as to facilitate connection with the liquid transport module 2. The conductive side 12 of the container 11 is used to contact with a heat generating source, such as CPU, chips and et cetera, in order to absorb the heat generated therefrom and to transfer the absorbed heat to the cool liquid contained in the container 11. The container 11 is provided with four mounting plates 111 for convenient installation around the desired object 4 (such as a CPU).

As shown in FIG. 4, the liquid transport module 2 includes a pump seat 21, at least one inlet tube 23 and an outlet tube 22. In this embodiment the inlet and outlet tubes 23, 22 are hollow tubes for passage of the liquid therethrough and can be configured any shape to fulfill the target purpose. First and second pump units 24, 25 are installed within the pump seat 21 (the specific structures of the first and second pump units 24, 25 are not visible). The inlet tube 23 has a first end connected spatially with the liquid outlet 112 of the liquid storage container 11 via a coupler head and a second end extending into the pump seat 21 for connecting with the second pump unit 25. The outlet tube 22 has a first end connected spatially with the liquid inlet 113 of the liquid storage container 11 and a second end extending into the pump seat 21 for spatially connected with the first pump unit 24.

Referring to FIGS. 4 and 5 again, wherein FIG. 5 shows a top planar view of the heat exchange module 3 employed in the liquid-cooled heat sink of the present while the solid arrows respectively indicate liquid flow directions therein. As shown, the heat exchange module 3 includes a fin assembly 31, a plurality connection passages 314 extending through the fin assembly 31 and one fan unit 33 mounted on the fin assembly 31. The fin assembly 31 includes a plurality of fins disposed in parallel manner so as to define a predetermined gap between adjacent pair of the fins for air to pass through. In this embodiment, the fin assembly 31 is provided with a mounting frame 311 for easy installation in an electronic device (like computer). The mounting frame 311 has first and second end attached to two opposite ends of the fin assembly 31, wherein, the first end of the mounting frame 311 defines a liquid storage chamber 32 which has a side wall 313 for isolating the same from the fin assembly 31 and a plurality of partition walls 315 disposed in the liquid storage chamber 32 so as to form a plurality of first chambers S1. The second end of the mounting frame 311 defines two second chambers S2 separated by a partition wall 316. Note that the connection passages 314 extend through the plurality of fins in a direction perpendicular to each fin. After assembly, the first ends of the connection passages 314 extend through the side wall 313 into the first chambers S1 respectively while the second ends of the connection passages 314 extend into the two second chambers S2. It is important to note that the above-mention liquid storage container 11, the outlet tube 22 and the inlet tube 23, the liquid storage chamber 32, the plurality of connecting passages 314, and the first and second pump units 24, 25 are filled with cool liquid.

Figure 5:
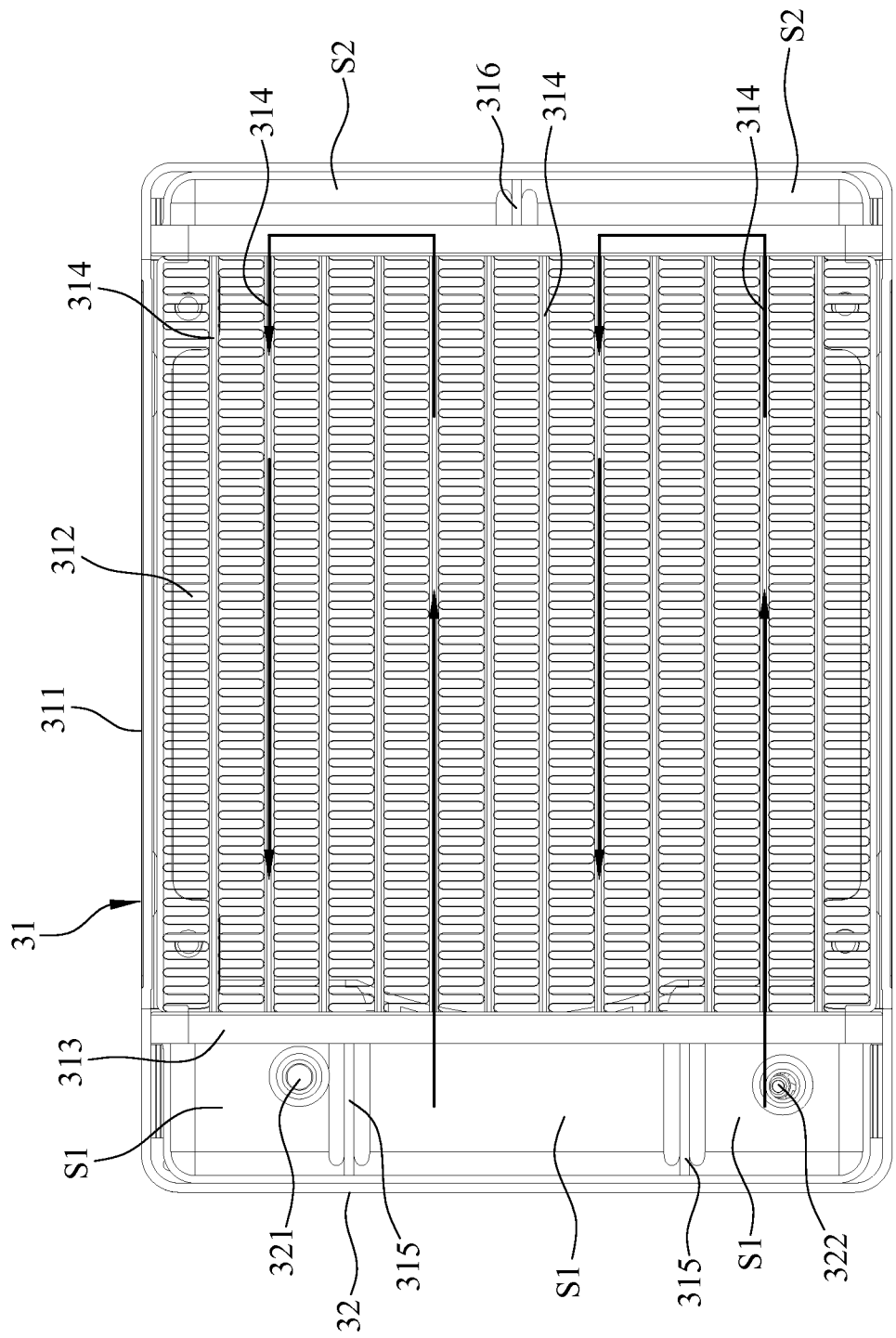
FIG. 5 shows a top planar view of a heat exchange module employed in the liquid-cooled heat sink of the present, wherein the solid arrows respectively indicate liquid flow directions therein.

To install the liquid-cooled heat sink of the present invention in an electronic device, first of all, the heat absorption module 1 is mounted in an electronic device in such a manner that heat conductive side 12 is in contact with a heat generating source, such as CPU, chips and et cetera, where the heat conductive side 12 absorbs the heat generated therefrom and transfers the absorbed heat to the cool liquid contained in the liquid storage container 11. Upon activation of the first and second pump units 24, 25 and the fan units 33, the first pump unit 24 pumps in the cool liquid and transfers the same via the outlet tube 22 into one of the first chambers S1 in the liquid storage chamber 32 so as to perform circulation of the liquid. As shown in FIG. 5, the cool liquid in the first chamber S1 is then transferred into the corresponding second chamber S2 via the connecting passages 314 and is again circulated into the first chamber S1 so as to perform circulation of the liquid between the first and second chambers S1, S2. Then, the second pump unit 25 pumps in the cool liquid into the liquid storage container 11 via the inlet tube 23 and performs circulation of the liquid such that as the cool liquid absorbing the heat passes through the connection passages 314, the heat is transferred to the fins 312 of the fin assembly 31. At this time, the heat is expelled from the fins in the downstream direction of the air generated owing to operation of the fan units 33 (as illustrated by arrows in FIG. 5), thereby effectively expelling the generated heat from an interior to an exterior of the electronic device.

As shown in FIG. 5, one specific feature of the present invention resides in that once the cool liquid, after absorbing the heat, enters into the rightmost side of first chamber S1 of the liquid storage chamber 32 via the outlet tube 22, and flows from the rightmost side first chamber S1 into the second chamber S2 via a first portion of the connection passages 314 which interconnecting the first chamber S1 and the second chamber S2. Afterward, the cool liquid flows from the second chamber S2 into the middle first chamber S1 via a second portion of the connection passages 314 interconnecting the second chamber S2 and the middle first chamber S1, thereby establishing a generally U-shaped flow direction (shown in solid arrow in FIG. 5). Again, the cool liquid flows from the second chamber S2 into the leftmost first chamber S1 via a third portion of the connection passages 314 interconnecting the second chamber S2 and the leftmost first chamber S1 and finally the second pump unit

25 pumps the cool liquid into the liquid storage container 11 via the inlet tube 23, thereby establishing another generally W-shaped flow direction (shown in solid arrow in FIG. 5). Under this condition, the liquid flow path of the heat sink of the present invention is prolonged when compared to that of traditional ones. Hence, the heat absorbed in the cool liquid is dissipated effectively by the fins 312 of the fin assembly 31 while the liquid flows and circulates between these chambers S1, S2.

While the invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A liquid-cooled heat sink including
    a heat absorption module,
    a liquid transport module and
    a heat exchange module,
    the liquid transport module including
        at least one inlet tube and
        an outlet tube, the at least one inlet tube has a first end and a second end, the outlet tube has a first end and a second end,
        while each of the inlet and outlet tubes having a first end connected with the heat absorption module,
    the heat exchange module including
        a fin assembly with a first end portion and a second end portion,
        at least one fan unit and
        a plurality of connection passages extending through two opposite end portions of the fin assembly, each connection passage has a first end and a second end,
    the liquid-cooled heat sink being characterized in that:
        the first end portion of the fin assembly defining a liquid storage chamber, which is further divided into a plurality of first chambers therein such that first ends of the connection passages extend into the first chambers and the second end portion of the fin assembly defining a plurality of second chambers such that the second ends of the connection passages extend into the second chambers, a pump seat for enclosing a first pump unit and a second pump unit is attached to the liquid storage chamber and the second ends of both the at least one inlet tube and outlet tube are connected respectively with the first pump unit and the second pump unit.

2. The liquid-cooled heat sink according to claim 1, wherein the heat absorption module further comprises
    a liquid storage container connected to the at least one inlet tube and the outlet tube; and
    a mounting plate for connecting to a heat generating device.

* * * * *